US007535069B2

(12) United States Patent
Abraham et al.

(10) Patent No.: US 7,535,069 B2
(45) Date of Patent: May 19, 2009

(54) MAGNETIC TUNNEL JUNCTION WITH ENHANCED MAGNETIC SWITCHING CHARACTERISTICS

(75) Inventors: David W. Abraham, Croton-on-Hudson, NY (US); Stephen L. Brown, Carmel, NY (US); Stuart P. Parkin, San Jose, CA (US); Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/452,741

(22) Filed: Jun. 14, 2006

(65) Prior Publication Data

US 2007/0297218 A1 Dec. 27, 2007

(51) Int. Cl.
*H01L 29/82* (2006.01)
*G11C 11/02* (2006.01)
(52) U.S. Cl. .......................... 257/421; 438/3; 365/158
(58) Field of Classification Search .................. 257/2, 257/295; 360/324.2; 365/158, 171; 427/130; 428/811.1; 438/4; 439/900
See application file for complete search history.

(56) References Cited

U.S. PATENT DOCUMENTS

| 6,545,906 | B1 | 4/2003 | Savtchenko et al. | |
|---|---|---|---|---|
| 2002/0085321 | A1* | 7/2002 | Carey et al. | 360/324.11 |
| 2004/0041183 | A1* | 3/2004 | Slaughter et al. | 257/295 |
| 2006/0054947 | A1* | 3/2006 | Asao et al. | 257/295 |
| 2006/0056115 | A1* | 3/2006 | Djayaprawira et al. | 360/324.2 |
| 2006/0262594 | A1* | 11/2006 | Fukumoto | 365/158 |

OTHER PUBLICATIONS

Park et al. Annealing effects on structural and transport properties of rf-sputtered CoFeB / MgO / CoFeB magnetic tunnel junctions., Journal of Applied Physics, 99, 08A901, (2006).*
Hayakawa et al. (Arxiv Public Pre-Print Server: cond-mat/0504051 available to the public Apr. 3, 2005 at http://arxiv.org/ftp/cond-mat/papers/0504/0504051.pdf) is cited as an example of a magnetic tunnel junction device with CoFeB ferromagnetic layers.*

(Continued)

*Primary Examiner*—Jerome Jackson, Jr.
*Assistant Examiner*—Jami M Valentine
(74) *Attorney, Agent, or Firm*—Ido Tuchman; Ryan, Mason & Lewis LLP (57) ABSTRACT

A semiconductor device formed between a wordline and a bitline comprises a growth layer, an antiferromagnetic layer formed on the growth layer, a pinned layer formed on the antiferromagnetic layer, a tunnel barrier layer formed on the pinned layer, and a free layer formed on the tunnel barrier. The wordline and bitline are arranged substantially orthogonal to one another. The growth layer, in turn, comprises tantalum and has a thickness greater than about 75 Angstroms. Moreover, the pinned layer comprises one or more pinned ferromagnetic sublayers. The tunnel barrier comprises magnesium oxide. Finally, the free layer comprises two or more free ferromagnetic sublayers, each free ferromagnetic sublayer having a magnetic anisotropy axis that is oriented about 45 degrees from the wordline and bitline. The semiconductor device may comprise, for example, a magnetic tunnel junction for use in magnetoresistive random access memory (MRAM) circuitry.

20 Claims, 4 Drawing Sheets

OTHER PUBLICATIONS

Kubota et al. Magnetization switiching by Spin Polarized Current in Low-Resistance Magnetic Tunnel Junction with MgO (001) Barrier, IEEE Transactions on Magnetics vol. 41, No. 10, Oct. 2005.*

U.S. Appl. No. 10/884,696, filed Jul. 2, 2004, S.P. Parkin.

D.W. Abraham et al., "Rapid-Turnaround Characterization Methods for MRAM Development," IBM J. Res. & Dev., vol. 50, No. 1, pp. 55-67, Jan. 2006.

D.C. Worledge, "Single-Domain Model for Toggle MRAM," IBM J. Res. & Dev., vol. 50, No. 1, pp. 69-79, Jan. 2006.

* cited by examiner

MAGNETIC TUNNEL JUNCTION WITH ENHANCED MAGNETIC SWITCHING CHARACTERISTICS

FIELD OF THE INVENTION

This invention relates generally to integrated circuits, and more particularly to magnetic tunnel junctions for use in magnetoresistive random access memory circuitry.

BACKGROUND OF THE INVENTION

Magnetoresistive random access memory (MRAM) is a memory technology that often uses a magnetic tunnel junction (MTJ) to store information. The basic MTJ comprises a pinned layer, an intervening tunnel barrier and a free layer. Typically, a pinned layer comprises one or more pinned ferromagnetic sublayers deposited on an antiferromagnetic layer. The interaction of the pinned layer and the antiferromagnetic layer acts to establish stable magnetic orientations in the pinned ferromagnetic sublayers for applied magnetic fields up to several hundred or thousand oersteds. A free layer comprises either a simple thin layer of ferromagnetic material or a multilayer structure comprising ferromagnetic and spacer sublayers. The tunnel barrier is often formed by oxidation of a thin metal sublayer (usually Al or Mg) which is grown between the pinned and free layers or by deposition of an oxide or nitride layer. In addition, a basic MTJ may also comprise one or more cap layers and growth layers. A cap layer may serve several purposes. It may be used to improve the magnetic properties of the free layer, act as a thermal diffusion barrier and/or allow for improved adhesion to the MTJ device. A growth layer, on the other hand, is usually found near the bottom of the MTJ and is designed to promote high-quality growth of subsequently deposited layers.

The resistance of the MTJ is either high or low, depending on the relative polarization (parallel or antiparallel) of the free layer with respect to the pinned layer. If the magnetic polarizations of the layers are parallel relative to one another, the resistance across the tunnel barrier is usually lower, while if the magnetic polarizations of the layers are antiparallel, the resistance is usually higher. In order to switch an MTJ device (i.e., write to the memory cell), a particular sequence of magnetic field pulses is applied to the MTJ using on-chip current pulses through wordlines and bitlines placed near the device. The particular sequence of magnetic field pulses depends on whether the free layer consists of one or more than one ferromagnetic sublayer. Writing to MTJs comprising a free layer having a single ferromagnetic sublayer (which is typically switched using the Stoner-Wohlfarth method) is described in, for example, D. Worledge, "Single-Domain Model for Toggle MRAM," IBM Journal of Research and Development, Vol. 50, No. 1, January 2006, p. 69, which is incorporated herein by reference. Writing to an MTJ comprising a free layer having two ferromagnetic sublayers (often called toggle or rotational switching) is described in, for example, the last cited journal article as well as U.S. Pat. No. 6,545,906, entitled "Method of Writing to Scalable Magnetoresistance Random Access Memory Element," which is also incorporated herein by reference.

Ferromagnetic sublayers deposited in the presence of an external magnetic field are characterized by a magnetic anisotropy axis determined by the direction and magnitude of the external magnetic field. That is, a sublayer displays an unambiguous difference in behavior when subsequently exposed to an external magnetic field applied parallel and perpendicular to a certain magnetic anisotropy axis in the sublayer. The sublayer's magnetic moment vector points along its magnetic anisotropy axis in zero applied magnetic field. Moreover, the sublayer is more easily switched between magnetic polarizations when an external magnetic field is applied to the sublayer in the direction parallel to its magnetic anisotropy axis. One of the keys to obtaining high quality switching in MTJs is, therefore, precise control of this magnetic anisotropy.

Notably, it has been recently observed by the inventors that growth layers in an MTJ may affect the resultant dispersion in the direction of the magnetic anisotropy in subsequently deposited ferromagnetic layers. In many cases, this effect is substantial. There is, as a result, a need for a toggle-type MTJ having a structure allowing the magnetic anisotropy axes in the ferromagnetic layers to be precisely controlled. In this way, the magnetic switching characteristics of the MTJ can be optimized

SUMMARY OF THE INVENTION

The present invention addresses the above-identified need by providing a novel toggle-type MTJ comprising ferromagnetic layers with precisely controlled magnetic anisotropy axes. Advantageously, this precise control results in optimized magnetic switching characteristics.

In accordance with an aspect of the invention, a semiconductor device formed between a wordline and a bitline comprises a growth layer, an antiferromagnetic layer formed on the growth layer, a pinned layer formed on the antiferromagnetic layer, a tunnel barrier layer formed on the pinned layer, and a free layer formed on the tunnel barrier. The wordline and bitline are arranged substantially orthogonal to one another. The growth layer, in turn, comprises tantalum and has a thickness greater than about 75 Angstroms. Moreover, the pinned layer comprises one or more pinned ferromagnetic sublayers. The tunnel barrier comprises magnesium oxide. Finally, the free layer comprises two or more free ferromagnetic sublayers, each free ferromagnetic sublayer having a magnetic anisotropy axis that is oriented about 45 degrees from the wordline and bitline.

In a preferred embodiment, an MTJ formed between a wordline and a bitline comprises (from bottom to top): 100 Å tantalum nitride/100 Å tantalum/120 Å iridium-manganese alloy/15 Å cobalt-iron alloy/13 Å magnesium oxide/40 Å cobalt-iron alloy/60 Å ruthenium/50 Å cobalt-iron alloy/100 Å tantalum nitride. The cobalt-iron alloy layers are ferromagnetic and are each formed with a common magnetic anisotropy axis that is oriented about 45 degrees from the wordline and bitline. Advantageously, this MTJ displays excellent toggle-switching characteristics and high magnetoresistance.

These and other features and advantages of the present invention will become apparent from the following detailed description which is to be read in conjunction with the accompanying figures.

DETAILED DESCRIPTION OF THE INVENTION

The present invention will be described with reference to illustrative embodiments in accordance with aspects of the present invention. As a result, numerous modifications and variations can be made to the embodiments described herein and the results will still come under the scope of this invention. No limitations with respect to the specific embodiments described are intended or should be inferred.

It should also be noted that the various layers and/or regions shown in the accompanying figures may not be drawn to scale, and that one or more layers and/or regions of a type commonly used in integrated circuits may not be explicitly shown in a given figure for economy of description. This does not imply that the layer(s) and/or regions(s) not explicitly shown are omitted from the actual integrated circuit.

The term "layer" as used herein is intended to encompass any stratum of matter. A layer may comprise a single material or several sublayers of different materials. Moreover, a ferromagnetic film is referred to as being "pinned" when its magnetic moment is not free to substantially rotate in the presence of an applied magnetic field of a magnitude that would normally be generated in an MRAM. On the other hand, a ferromagnetic film is referred to as being "free" when its magnetic moment may be rotated by an applied magnetic field of a magnitude that would normally be generated in an MRAM.

Figure 1:
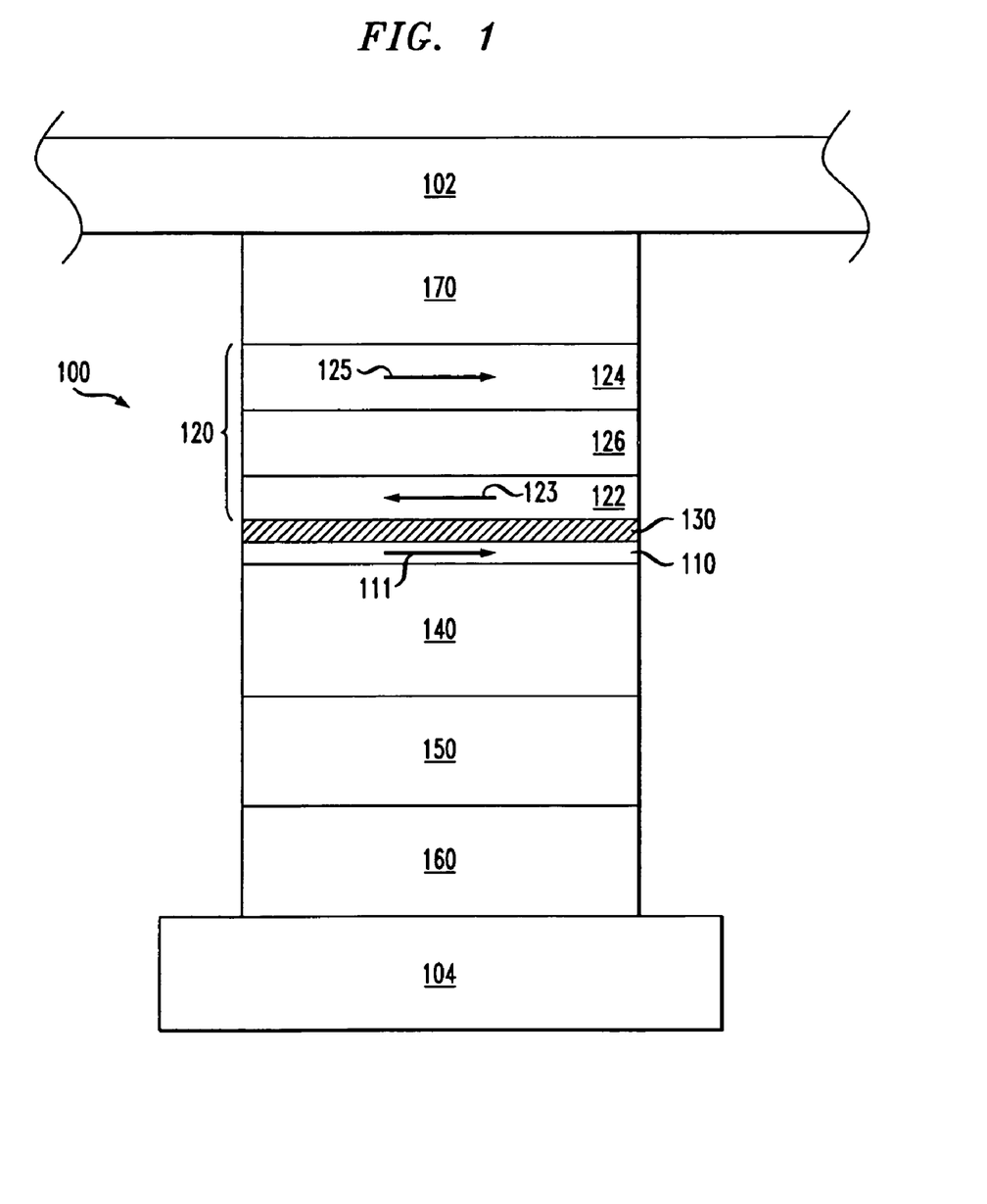
FIG. 1 shows a sectional view of an MTJ in accordance with a preferred embodiment of the invention.

FIG. 1 illustrates a simplified sectional view of an MTJ 100 in accordance with a preferred embodiment of the present invention. The MTJ is sandwiched between a wordline 102 and a bitline 104. The wordline is positioned on top of the MTJ, and the bitline is positioned on the bottom of the MTJ, although the invention contemplates alternative configurations for the wordline and bitline.

The MTJ 100 includes a pinned layer 110 and a free layer 120. A tunnel barrier layer 130 lies in between these layers. The free layer, in turn, comprises three sublayers, more particularly, a lower free ferromagnetic sublayer 122 and an upper free ferromagnetic sublayer 124, separated by a spacer sublayer 126. The spacer sublayer can either exchange couple the free ferromagnetic sublayers or merely act as a non-magnetic spacer. An antiferromagnetic layer 140 lies below the pinned layer 110. Moreover, the MTJ further comprises a growth layer 150, formed directly below the antiferromagnetic layer 140, as well as lower and upper cap layers, 160 and 170, respectively. The lower and upper cap layers form the interfaces between the MTJ and the wordline 102 and bitline 104, respectively.

In the MTJ 100, the lower and upper cap layers 160, 170 preferably comprise about 100 Å of tantalum nitride (TaN). Tantalum nitride acts as a thermal diffusion barrier for many metallic elements, including copper, a common element for use in wordlines and bitlines. The spacer layer 150, on the other hand, preferably comprises about 100 Å of tantalum (Ta). The antiferromagnetic layer 140 preferably comprises about 120 Å of a combination of iridium and manganese (IrMn). Moreover, the spacer sublayer 126 preferably comprises about 60 Å of ruthenium (Ru). The pinned layer 110 and the free ferromagnetic sublayers 122, 124 preferably comprise an alloy of boron-doped cobalt and iron (CoFeB), thereby making these layers ferromagnetic. The pinned layer preferably has a thickness of about 15 Å while the lower and upper free ferromagnetic sublayers preferably have thicknesses of about 40 Å and about 50 Å respectively. The magnetic anisotropy axes of these ferromagnetic layers can be set by applying a uniform external magnetic field during their deposition.

The tunnel barrier 130 in the MTJ 100 comprises magnesium oxide (MgO). The tunnel barrier thickness is preferably about 13 Å, but other suitable thicknesses will still fall within the scope of the invention. The use and formation of MgO tunnel barriers in MTJs has been described in, for example, U.S. patent application Ser. No. 10/884,696, entitled "Magnetic Tunnel Barriers and Associated Magnetic Tunnel Junctions with High Tunneling Magnetoresistance," which is incorporated herein by reference. A MgO tunnel barrier may be deposited, for example, by first depositing a very thin layer (e.g., about 3 Å) of magnesium metal and then depositing additional magnesium in the presence of oxygen. Advantageously, an MgO tunnel barrier displays high magnetoresistance properties when properly incorporated into an MTJ. Tunneling magnetoresistances (i.e., the difference in the electrical resistance of the MTJ in its higher and lower electrical resistance states) exceeding, for example, 100% are readily achieved by using MgO tunnel barriers.

It should be noted that many of the above material choices, thicknesses and deposition methods are merely illustrative of the preferred embodiment and, therefore, other material choices, thicknesses and deposition methods would still fall within the scope of the invention. For example, rather than comprising ruthenium, the spacer sublayer 126 may comprise copper, chromium, molybdenum, niobium, tungsten, osmium, iridium or tantalum, or a combination thereof. The possible variations on the preferred embodiment falling within the scope of the invention will be familiar to one skilled in the art.

Methods of depositing the above-described elements will be familiar to one skilled in the semiconductor processing art. The elements may, for example, be deposited using physical vapor deposition and/or ion beam deposition techniques that are readily utilized in conventional semiconductor processing. These deposition techniques are described in detail in a number of readily available references including, for example, R. F. Bunshah, editor, *Handbook of Deposition Technologies for Films and Coatings, Science, Technology and Applications, Second Edition*, Noyes Publications, 1994, which is incorporated herein by reference.

Because of their ferromagnetic properties, each of the pinned layer 110 and the free ferromagnetic sublayers 122, 124 will have an associated magnetic moment vector, shown in FIG. 1 as arrows labeled 111, 123 and 125, respectively. Without the influence of an external magnetic field, these magnetic moment vectors tend to align parallel to the magnetic anisotropy axes of their respective ferromagnetic layers. Because of a combination of dipolar coupling and any exchange coupling provided by the spacer sublayer 126, the free magnetic moment vectors 123, 125 will tend to remain antiparallel with respect to one another.

In the preferred embodiment shown in FIG. 1, the pinned magnetic moment vector 111 is not free to rotate in the presence of an applied magnetic field of a magnitude that would normally be generated in the MTJ 100. This restriction to rotation occurs primarily because of the coupling between pinned layer 110 and the adjacent antiferromagnetic layer 140. The pinned layer therefore acts as a reference. The free magnetic moment vectors 123, 125, on the other hand, are free to rotate in the presence of an applied magnetic field which may be generated by current flow in the wordline 102 and bitline 104. The orientation of the free magnetic moment vectors within the free layer 120 thereby acts to establish the state of the MTJ for the purpose of storing digital information.

Figure 2:
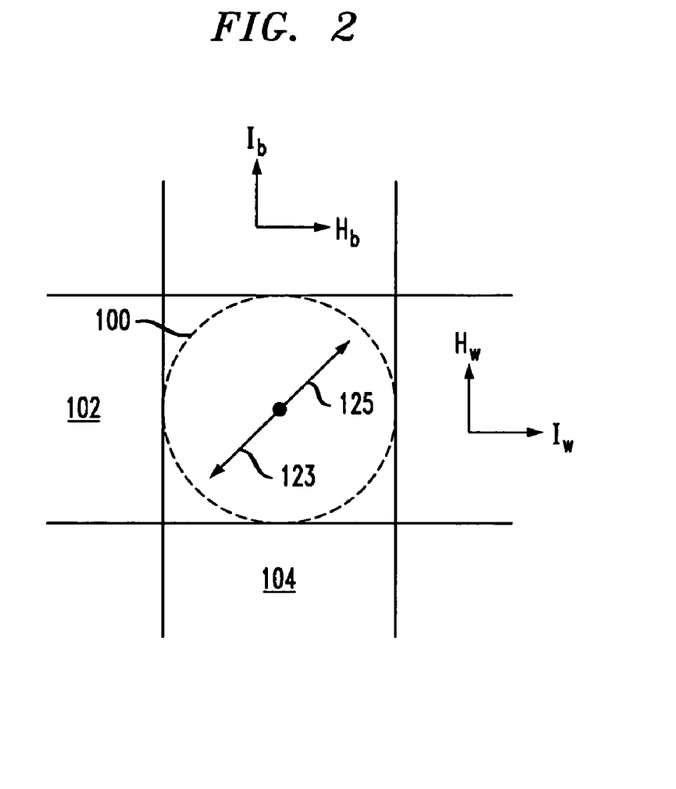
FIG. 2 shows a plan view of the FIG. 1 MTJ.

Furthermore, the pinned layer 110 and free ferromagnetic sublayers 122, 124 are preferably configured to have magnetic anisotropy axes oriented at an angle about 45 degrees from the directions of the wordline 102 and bitline 104. This orientation allows the free magnetic moment vectors 123, 125 to be switched using a particular sequence of wordline and bitline currents, described in more detail below. FIG. 2 shows a simplified plan view of the MTJ 100 with the wordline and bitline. The wordline and bitline are preferably orthogonal to one another. Moreover, the figure clearly shows the 45 degree angle between the free magnetic moment vectors and the wordline/bitline. The direction of positive current flow in the wordline and bitline are also shown in FIG. 2 as $I_w$ and $I_b$, respectively. Positive current flow in the wordline and bitline produce circumferential magnetic fields $H_w$ and $H_b$, respectively.

Figure 3:
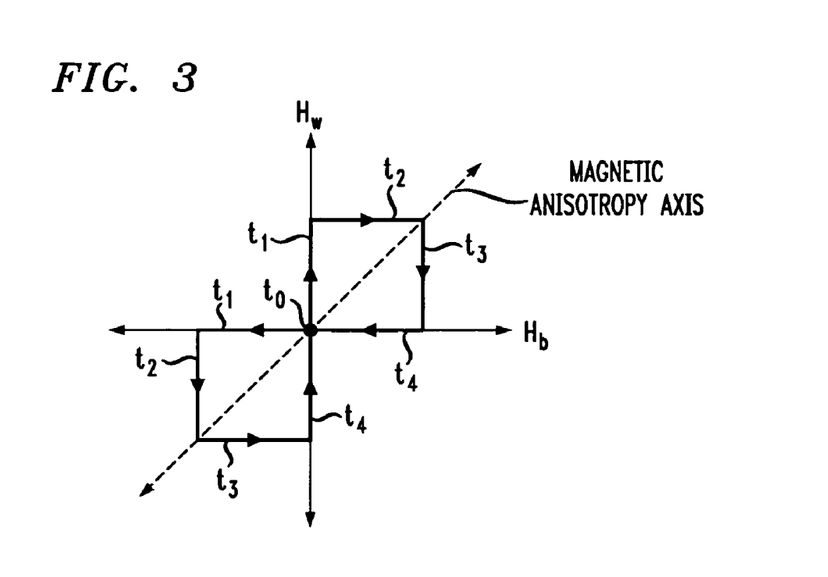
FIG. 3 shows a graph illustrating magnetic field pulse sequences for switching the FIG. 1 MTJ.

A tri-layer structure like the free layer 120 shown in FIG. 1 may be switched using toggle-write operations. Such write operations are described in detail in U.S. Pat. No. 6,545,906, which has been previously cited and incorporated by reference. Briefly, a toggle-write operation is achieved by using a particular sequence of timed current pulses in the wordline 102 and bitline 104. FIG. 3 shows the applied magnetic fields, $H_w$ and $H_b$, resulting from these current pulses for both positive and negative current polarities. At a time $t_0$, no current flows in either the wordline or bitline and the free magnetic moment vectors 123, 125 remain oriented along the magnetic anisotropy axes of free magnetic sublayers 122, 124 in a direction 45 degrees from the wordline 102 and bitline 104. At a time $t_1$, a wordline current is turned on, thereby creating a magnetic field, $H_w$, and the free magnetic moment vectors begin to rotate either clockwise or counterclockwise, depending on the polarity of the wordline current, so as to orient themselves in a scissor-like state nominally orthogonal to this applied field direction. Later at a time $t_2$, the bitline current is switched on while the wordline current remains on. The added current in the bitline causes the free magnetic moment vectors to further rotate in the same direction as the rotation induced by the wordline current. At this point in time, the free magnetic moment vectors are nominally orthogonal to the average applied magnetic field direction, $H_w+H_b$, which is 45 degrees with respect to the wordline and bitline.

At a time $t_3$, the wordline current is switched off, so that the free magnetic moment vectors 123, 125 are further rotated only by an applied magnetic field generated by the bitline 104, $H_b$. At this point, the magnetic moment vectors have generally been rotated past their hard axis instability points. Therefore, at time $t_4$, when the bitline current is switched off, the free magnetic moment vectors will tend to align again along the magnetic anisotropy axes of free magnetic sublayers 122, 124. At this point in time, the free magnetic moment vectors have been rotated by 180 degrees and the MTJ 100 has been toggled.

As mentioned before, careful choice of the growth layer composition and thickness will have a substantial effect on the dispersion in the direction of the magnetic anisotropy in subsequently deposited ferromagnetic layers. In order to determine the optimum growth layer configuration, Kerr magnetometry studies were performed on blanket film stacks relevant to the preferred embodiment of the MTJ described above. Some film stacks contained no tantalum growth layers while other contained tantalum growth layers of various thicknesses. The use of Kerr magnetometry to study magnetic anisotropy in ferromagnetic films in MRAM devices is described in numerous references including, for example, D. W. Abraham et al., "Rapid-turnaround Characterization Methods for MRAM Development," IBM Journal of Research and Development, Vol. 50, No. 1, January 2006, p. 55, which is incorporated herein by reference.

Briefly, Kerr magnetometry measures the rotation of the polarization of light reflected from the surface of a magnetic material under study as a function of applied magnetic field. The Kerr signal is proportional to the magnetic moment of the sample under test, although a fundamental calibration constant giving a quantitative measure of sample magnetic moment per amount of polarization rotation is not available. Nonetheless, for a given sample or set of similar samples, the Kerr signal is proportional to the sample magnetic moment parallel to the optical beam, with the same calibration constant for all samples within a series. Kerr magnetometers are commercially available. One commercial manufacturer is, for example, ADE Technologies (Westwood, Mass.).

Figure 4A:
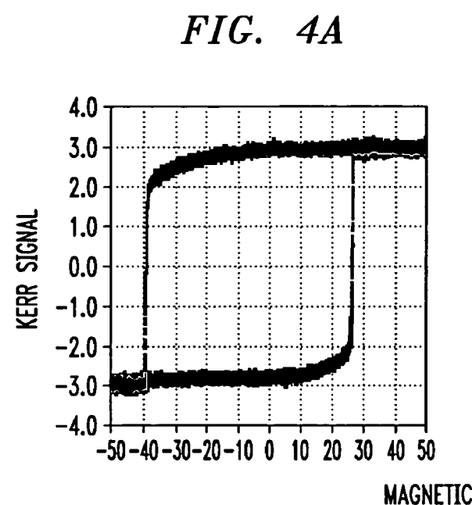
FIG. 4A shows Kerr magnetometry signal as a function of external magnetic field applied in a direction parallel to the magnetic anisotropy axis for a test film stack without a tantalum growth layer.
Figure 4B:
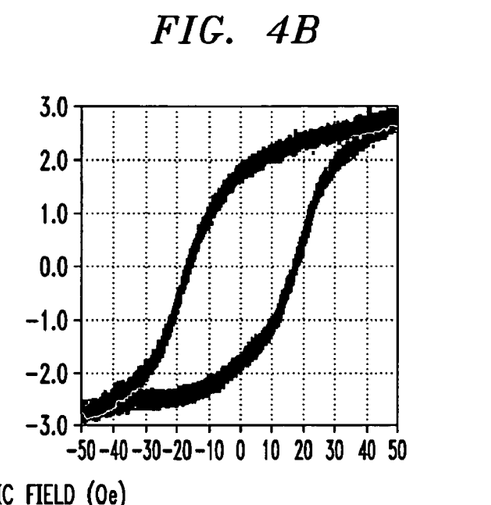
FIG. 4B shows Kerr magnetometry signal as a function of external magnetic field applied in a direction perpendicular to the magnetic anisotropy axis for a test film stack without a tantalum growth layer.
Figure 5A:
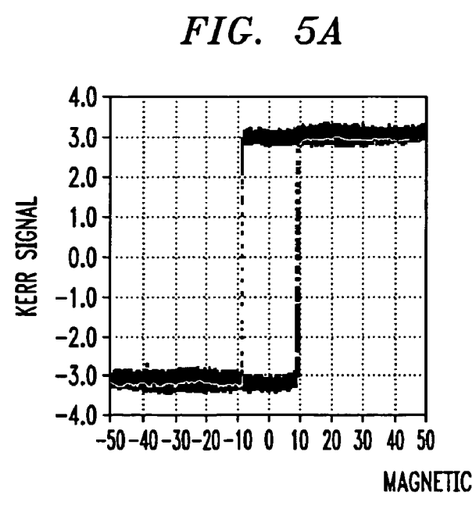
FIG. 5A shows Kerr magnetometry signal as a function of magnetic field applied in a direction parallel to the magnetic anisotropy axis for a test film stack with a 100 Å tantalum growth layer.
Figure 5B:
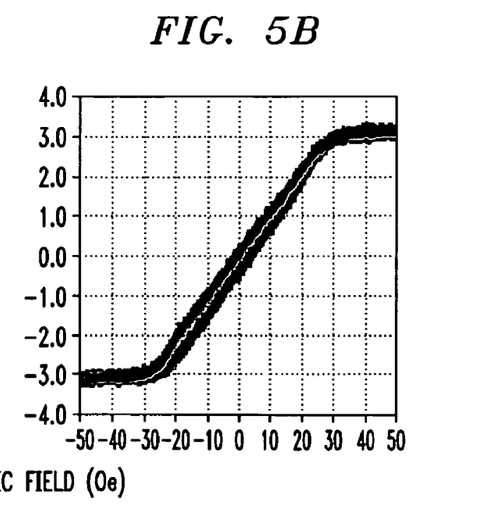
FIG. 5B shows Kerr magnetometry signal as a function of external magnetic field applied in a direction perpendicular to the magnetic anisotropy axis for a test film stack with a 100 Å tantalum growth layer.

FIGS. 4A and 4B show Kerr magnetometry measurements for a film stack without a tantalum growth layer. More specifically, the film stack under study comprised (from bottom to top): 100 Å TaN/120 Å IrMn/15 Å CoFeB/18 Å MgO/35 Å CoFeB. In contrast, FIGS. 5A and 5B show analogous Kerr magnetometry measurements for a film stack containing a 100 Å tantalum growth layer. More specifically, this film stack comprised (from bottom to top): 100 Å TaN/100 Å Ta/120 Å IrMn/15 Å CoFeB/18 Å MgO/35 Å CoFeB. In all cases, the ferromagnetic layers (i.e., CoFeB layers) were deposited under the influence of an applied magnetic field to define a common magnetic anisotropy axis in these films. FIGS. 4A and 5A show the Kerr signal as a function of magnetic field applied to the samples parallel to the direction of the magnetic anisotropy axis in the ferromagnetic layers. FIGS. 4B and 5B, on the other hand, show the Kerr signal for the same samples with the external magnetic field applied along an axis perpendicular to the magnetic anisotropy axis in the ferromagnetic layers. In each case, the applied magnetic field was swept from one polarity to the other (negative to positive, positive to negative) several times to create the loops shown.

The squareness of the loops shown in FIGS. 4A and 5A and the size of the openings in the loops shown in FIGS. 4B and 5B are indicative of the extent of control of the magnetic anisotropy in the associated samples. The rounding of the loop in FIG. 4A and relatively large opening in the loop shown in FIG. 4B are indicative of a large dispersion in the direction of the magnetic anisotropy across the ferromagnetic layers in the sample without the tantalum growth layer. As a result, such a film stack, if it were implemented in an MTJ, would be characterized by poor toggle-switching properties. In contrast, the squareness of the loop in FIG. 5A and the tightness of the loop in FIG. 5B are indicative of high quality ferromagnetic films with very little dispersion in the direction of the magnetic anisotropy. Such a film stack, when incorporated into an MTJ like the MTJ 100, would show excellent toggle-switching properties because of the uniformity of the direction of the magnetic anisotropy across the sample.

Figure 6:
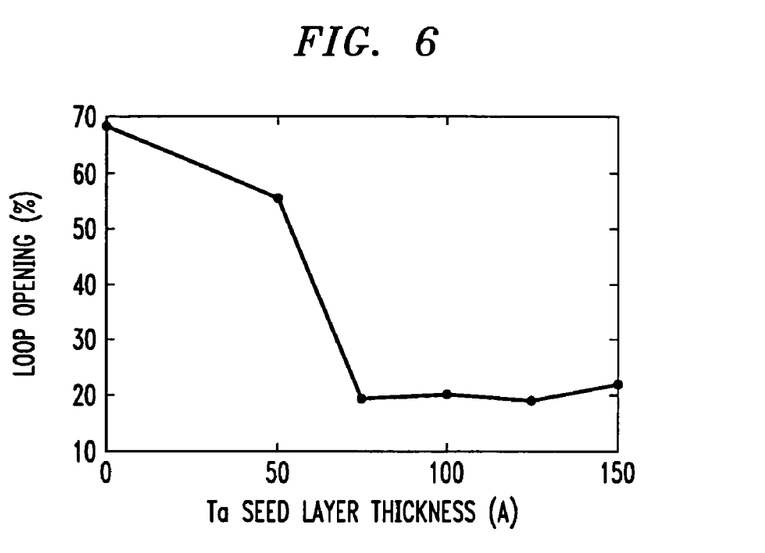
FIG. 6 shows the percentage openings in the Kerr magnetometry loops as a function of tantalum growth layer thickness for external magnetic fields applied in a direction perpendicular to the magnetic anisotropy axes of the test film stacks.

FIG. 6 shows a summary of Kerr magnetometry measurements for film stacks comprising: 100 Å TaN/xÅ Ta/120 Å IrMn/15 Å CoFeB/18 Å MgO/35 Å CoFeB, where x=0, 50, 75, 100, 125 and 150. The y-axis in FIG. 6 is the percentage opening in the Kerr signal loops where the applied magnetic field was applied along an axis perpendicular to the magnetic anisotropy axis in the ferromagnetic layers. FIG. 6, therefore, includes data obtained from the loops in FIG. 4B (no Ta growth layer, x=0) and FIG. 5B (100 Å Ta growth layer, x=100). FIG. 6 clearly shows that substantially better control of the dispersion in the direction of the magnetic anisotropy is achieved by use of a tantalum growth layer with a thickness greater than about 75 Å.

Figure 7:
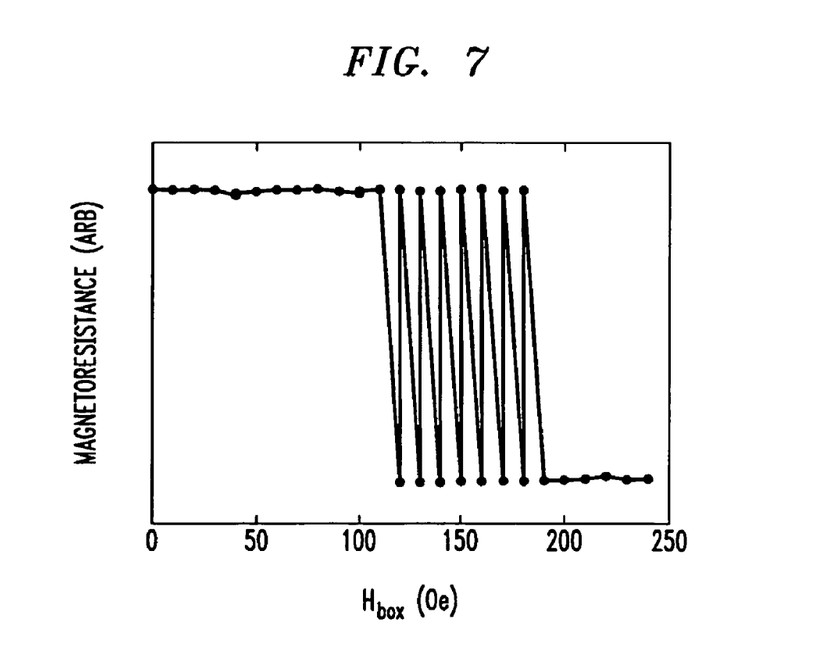
FIG. 7 shows the magnetoresistance of the FIG. 1 MTJ in response to the FIG. 3 magnetic field pulse sequences.

FIG. 7 shows toggle-writing data for the MTJ 100. As described above, this MTJ has a tantalum growth layer 150 with a thickness of 100 Å. The experiments are started with the MTJ in its high resistance state (i.e., the state wherein the pinned layer magnetic moment vector 111 and the lower free ferromagnetic sublayer magnetic moment vector 123 are antiparallel to one another). In these experiments, the wordline 102 and bitline 104 are swept through the box pattern shown in FIG. 3 in the positive direction with progressively larger current pulses. The x-axis of FIG. 7, labeled $H_{box}$, shows the magnitude of each of the magnetic fields created by the wordline and bitline. It will be observed that the MTJ starts to switch back and forth between electrical resistance states with each sweep of the current pulses when $H_{box}$ equals about 125 oersteds. Advantageously, such toggle-switching behavior indicates that this MTJ design can be successfully implemented in a modern integrated circuit without exceeding electrical current generating capacities of typical wordline and bitline driving circuitry. As described above, if the tantalum growth layer had a thickness less than about 75 Å, the toggling properties would be substantially inferior in comparison to those shown in FIG. 7.

It should be noted that the apparatus and methods described herein may be implemented to form an integrated circuit. In forming integrated circuits, a plurality of identical die is typically fabricated in a repeated pattern on a surface of a semiconductor wafer. Each die includes a device formed in accordance with aspects of the invention described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Moreover, it should also be emphasized that, although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device formed between a wordline and a bitline, the wordline and bitline being arranged substantially orthogonal to one another, the semiconductor device comprising:

a growth layer, the growth layer comprising tantalum and having a thickness greater than about 75 Angstroms;

an antiferromagnetic layer, the antiferromagnetic layer being formed on the growth layer;

a pinned layer, the pinned layer being formed on the antiferromagnetic layer and comprising one or more pinned ferromagnetic sublayers;

a tunnel barrier layer, the tunnel barrier being formed on the pinned layer and comprising magnesium oxide; and a free layer, the free layer being formed on the tunnel barrier layer and comprising two or more free ferromagnetic sublayers, each free ferromagnetic sublayer having a magnetic anisotropy axis that is oriented about 45 degrees from the wordline and bitline.

2. The semiconductor device of claim 1, wherein the semiconductor device comprises a magnetic tunnel junction.

3. The semiconductor device of claim 1, wherein data can be written to the semiconductor device by toggle-write operations.

4. The semiconductor device of claim 1, wherein the antiferromagnetic layer comprises iridium and manganese.

5. The semiconductor device of claim 1, wherein at least one of the pinned layer and free layer comprises iron and cobalt.

6. The semiconductor device of claim 1, wherein at least one of the pinned layer and free layer comprises boron.

7. The semiconductor device of claim 1, wherein the free layer comprises a lower free ferromagnetic sublayer formed on the tunnel barrier and an upper free ferromagnetic sublayer separated from the lower free ferromagnetic sublayer by a spacer sublayer.

8. The semiconductor device of claim 7, wherein magnetic moment vectors of the lower and upper free ferromagnetic sublayers are oriented antiparallel with respect to one another when no external magnetic field is applied to the semiconductor device.

9. The semiconductor device of claim 7, wherein the spacer sublayer comprises copper, chromium, molybdenum, ruthenium, niobium, tungsten, osmium, iridium or tantalum, or a combination thereof.

10. The semiconductor device of claim 1, wherein the pinned layer comprises a lower pinned ferromagnetic sublayer formed on the antiferromagnetic layer and an upper pinned ferromagnetic sublayer separated from the lower pinned ferromagnetic sublayer by an antiferromagnetic coupling sublayer.

11. The semiconductor device of claim 10, wherein magnetic moment vectors of the lower and upper pinned ferromagnetic sublayers are antiparallel with respect to one another.

12. The semiconductor device of claim 1, wherein the pinned layer comprises three or more pinned ferromagnetic sublayers.

13. The semiconductor device of claim 1, wherein the minimum dimension of the free layer in a plane substantially parallel to the plane incorporating an interface of the free layer and the tunnel barrier layer is less than about 200 nanometers.

14. An integrated circuit comprising at least one semiconductor device, the at least one semiconductor device being formed between a wordline and a bitline, the wordline and bitline being arranged substantially orthogonal to one another, the at least one semiconductor device comprising:

a growth layer, the growth layer comprising tantalum and having a thickness greater than about 75 Angstroms;

an antiferromagnetic layer, the antiferromagnetic layer being formed on the growth layer;

a pinned layer, the pinned layer being formed on the antiferromagnetic layer and comprising one or more pinned ferromagnetic sublayers;

a tunnel barrier layer, the tunnel barrier being formed on the pinned layer and comprising magnesium oxide; and a free layer, the free layer being formed on the tunnel barrier layer and comprising two or more free ferromagnetic sublayers, each free ferromagnetic sublayer having a magnetic anisotropy axis that is oriented about 45 degrees from the wordline and bitline.

15. The integrated circuit of claim 14, wherein the semiconductor device comprises a magnetic tunnel junction.

16. The integrated circuit of claim 14, wherein the integrated circuit comprises magnetoresistive random access memory circuitry.

17. A method of forming a semiconductor device between a wordline and a bitline, the wordline and bitline being arranged substantially orthogonal to one another, the method comprising the steps of:

forming a growth layer, the growth layer comprising tantalum and having a thickness greater than about 75 Angstroms;

forming an antiferromagnetic layer on the growth layer;

forming a pinned layer on the antiferromagnetic layer, the pinned layer comprising one or more pinned ferromagnetic sublayers;

forming a tunnel barrier layer on the pinned layer, the tunnel barrier comprising magnesium oxide; and forming a free layer on the tunnel barrier layer, the free layer comprising two or more free ferromagnetic sublayers, each free ferromagnetic sublayer having a magnetic anisotropy axis that is oriented about 45 degrees from the wordline and bitline.

18. The method of claim 17, wherein the step of forming the growth layer comprises physical vapor deposition.

19. The method of claim 17, wherein the step of forming at least one of the two or more free ferromagnetic sublayers comprises physical vapor deposition in the presence of an applied magnetic field.

20. The method of claim 17, wherein the step of forming the tunnel barrier comprises ion beam deposition.

* * * * *